(12) United States Patent
Eurlings et al.

(10) Patent No.: US 7,349,066 B2
(45) Date of Patent: Mar. 25, 2008

(54) APPARATUS, METHOD AND COMPUTER PROGRAM PRODUCT FOR PERFORMING A MODEL BASED OPTICAL PROXIMITY CORRECTION FACTORING NEIGHBOR INFLUENCE

(75) Inventors: Markus Franciscus Antonius Eurlings, Tilburg (NL); Thomas Laidig, Point Richmond, CA (US); Uwe Hollerbach, Franklin, MA (US)

(73) Assignee: ASML Masktools B.V., Veldhoven (NL)

( * ) Notice: Subject to any disclaimer, the term of this patent is extended or adjusted under 35 U.S.C. 154(b) by 231 days.

(21) Appl. No.: 11/122,220

(22) Filed: May 5, 2005

(65) Prior Publication Data
US 2006/0250589 A1 Nov. 9, 2006

(51) Int. Cl.
*G03B 27/70* (2006.01)
*G03B 27/42* (2006.01)
*G06F 17/50* (2006.01)

(52) U.S. Cl. .............................. 355/52; 355/53; 716/19
(58) Field of Classification Search .................. 355/52, 355/53, 55, 67, 77; 716/19
See application file for complete search history.

(56) References Cited

U.S. PATENT DOCUMENTS

2003/0110465 A1  6/2003  Zhang
2004/0102945 A1  5/2004  Liu
2005/0055658 A1*  3/2005  Mukherjee et al. ........... 716/19

OTHER PUBLICATIONS

Australian Search Report and Written Opinion, issued in corresponding Australian Patent Application No. SG 200603016-7, dated on Jul. 3, 2007.

* cited by examiner

*Primary Examiner*—Peter B. Kim
(74) *Attorney, Agent, or Firm*—McDermott Will & Emery LLP

(57) ABSTRACT

Model Based Optical Proximity Correction (MOPC) biasing techniques may be utilized for optimizing a mask pattern. However, conventional MOPC techniques do not account for influence from neighboring features on a mask. This influence may be factored in the following manner—first, generating a predicted pattern from a target pattern and selecting a plurality of evaluation points at which biasing may be determined. Next, a set of multivariable equations are generated for each evaluation point, each equation representing influence of neighboring features on a mask. The equations are solved to determine that amount of bias at each evaluation point, and the mask is optimized accordingly. This process may be repeated until the mask pattern is further optimized.

21 Claims, 4 Drawing Sheets

APPARATUS, METHOD AND COMPUTER PROGRAM PRODUCT FOR PERFORMING A MODEL BASED OPTICAL PROXIMITY CORRECTION FACTORING NEIGHBOR INFLUENCE

FIELD OF THE INVENTION

The present invention relates to a model based optical proximity correction ("MOPC) for mask optimization, and more particularly, an MOPC factoring the influence of neighbors during mask optimization.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). However, because of increasingly microscopic size of lithographic features and high resolution systems, slight deviation of the resulting features printed on the substrate may render the device inoperable. These deviations are typically caused by physical variations (or diffraction limited imaging) of the equipment generating the image on the substrate, illumination characteristics of the system are mask, etc.

In the current state of the art, model based optical proximity correction ("MOPC) techniques provide corrective measures to minimize this undesirable deviation. MOPC determines deviation based on a comparison of simulated images, i.e., a comparison of target image, which represents the desired image to be formed on a substrate, with a predicted image, which accounts for characteristics of the illumination system, substrate, etc. In actuality, the target and predicted images are divided in a plurality of sections.

FIG. 1 illustrates an exemplary section 10 of a target image 12 and corresponding predicted image 14 (superimposed thereon). Generally, a lithographer utilizing MOPC techniques will analyze a target image at an evaluation point A typically located at the center of the respective section 10 for determining the amount of biasing that is needed at that point. This will be repeated for a different evaluation point (s) until satisfactory results are obtained.

Software packages may be utilized to assist in the MOPC analysis. As such, the target image may be represented by a mathematical expression, from which the predicted image may be derived. Well known mathematical algorithms may be utilized for determining the deviation between the target image 12 and the predicted image 14, such as the "Newton method." The Newton method uses an iterative algorithm to determine a root of a function representing the amount of deviation between the target image 12 and the predicted image 14. The amount of deviation may then be used to determine the amount of biasing needed to compensate for the deviation.

Equation 1 represents the Newton formula for correcting a mask edge.

$$\rightarrow \Delta F = \Delta I \left( \frac{\partial xy}{\partial I} \right)$$ Equation 1

FIG. 2 illustrates a plot of certain components of equation 1. Line 16 represents the intensity profile at a given evaluation point. $\partial I/\partial xy$ (designated by numeral 18) represents the slope of the feature profile at the given evaluation point. $\partial I$ represents the deviation (i.e., error in the intensity value) between the target image and the predicted image at the given evaluation point. $\Delta F$ (not illustrated) represents the amount of bias required to shift an edge of the evaluation point to compensate for the deviation between the target image 12 and the predicted image 14. If the target image 12 and predicted image 14 were the same, the intersection between the intensity profile (line 16) and line 18 would coincide with the origin of the graph, as is illustrated in FIG. 3. In other words, $\Delta I$ would be 0.

MOPC uses either an aerial image model or a calibrated model as the predicted image. A calibrated model however considers mask properties, characteristics of the tools to create the mask, resist properties, etc, and is therefore highly accurate Disadvantages to using a calibrated model include extensive calibration, including building a mask and exposing wafers, and factoring then arbitrary imaging properties that cannot be attributed to the mask, semiconductor, or any associate property. Also, the main disadvantage to using a calibrated model is that an optimized mask must be used for calibration. If one is not used, the calibrated model likely will produce inaccurate results. Thus, industry often uses the aerial image for MOPC, because it expedites and facilitates the process as it does not rely on existing tools. However, aerial models do not factor in real life imperfections, as in the case of using a calibrated model.

Regardless of the model utilized, the inventors have found that the conventional MOPC techniques do not take into account the influence of neighboring features for a given section of a target pattern. In other words, MOPC considers only the deviation between a target image and a predicted image at a given evaluation point, and does not consider errors in intensity caused by neighboring features in a given mask pattern. As a result, deviation between the target image and a prediction image remains.

SUMMARY

In an effort to address the foregoing needs, the novel concepts described further herein conform existing MOPC techniques to account for the affect of neighboring features when computing an amount of bias for a given feature. More specifically, the novel concepts described herein relate to method for optimizing a mask pattern to be imaged on a surface of a substrate. The method steps include: (a) generating a target pattern corresponding to the mask pattern to be imaged; (b) simulating a predicted pattern from the target pattern of the image to be formed on the surface of the substrate; (c) sectioning features of the target pattern and selecting at least two sections for evaluation; (d) computing an amount of bias needed for each of the at least two sections by factoring the influence from at least one other section of the at least two sections; (e) modifying the target pattern according to the results of step (d) for optimizing the mask pattern; (f) simulating a second predicted pattern from the modified target pattern of step (e); and (g) analyzing the second predicted pattern to determine if the modified target pattern has been biased sufficiently for optimizing the mask pattern. If from step (g) biasing is insufficient, repeating steps (d) through steps (g), wherein the modified target pattern of step (e) becomes the target pattern of step (c). If from step (g) biasing is sufficient, generating an optimized mask according to the modified target pattern.

The aforementioned novel concepts may be embodied by a computer program product and even an apparatus utilizing model optical proximity correction (MOPC) for optimizing a pattern to be formed on a surface of a substrate. The apparatus could include a radiation system for supplying a projection beam; an illuminator for receiving the projection beam of radiation and projecting an adjusted beam of radiation a portion of a mask; a projection system having a numerical aperture ("NA") for imaging a corresponding irradiated portion of a mask, onto a target portion of a substrate; and a computer system for performing the aforementioned steps.

The novel concepts present significant advantages over conventional MOPC techniques. By factoring the influence of neighboring features, accuracy of bias calculations increase. It follows that masks may be further optimized for enhancing patterns to be imaged on a surface of a substrate.

The foregoing and other features, aspects, and advantages of the present disclosure will become more apparent from the following detailed description when taken in conjunction with the accompanying drawings.

DETAILED DESCRIPTION

In general, the MOPC techniques described herein entail determining the amount of bias needed to optimize a mask pattern while factoring the influence from neighboring features on a mask. The techniques include generating a predicted pattern from a target pattern and selecting a plurality of evaluation points at which biasing may be determined. A set of multivariable equations are generated for each evaluation point for factoring influence of neighboring features on a mask. The series of equations are then solved to determine the amount of bias at each evaluation point, and the target pattern is modified accordingly. Because MOPC is an iterative process, again, a predicted image is generated from the modified target image for determining whether or not biasing was sufficient. If not, the evaluation described above is repeated until an adequate image has been obtained. By performing the foregoing, the influence of neighbors of a given pattern may be taken into account thereby accurately reducing deviation between a target image and the actual image that would be printed on a surface substrate. This of course greatly optimizes a mask to be formed using MOPC techniques.

Figure 1:
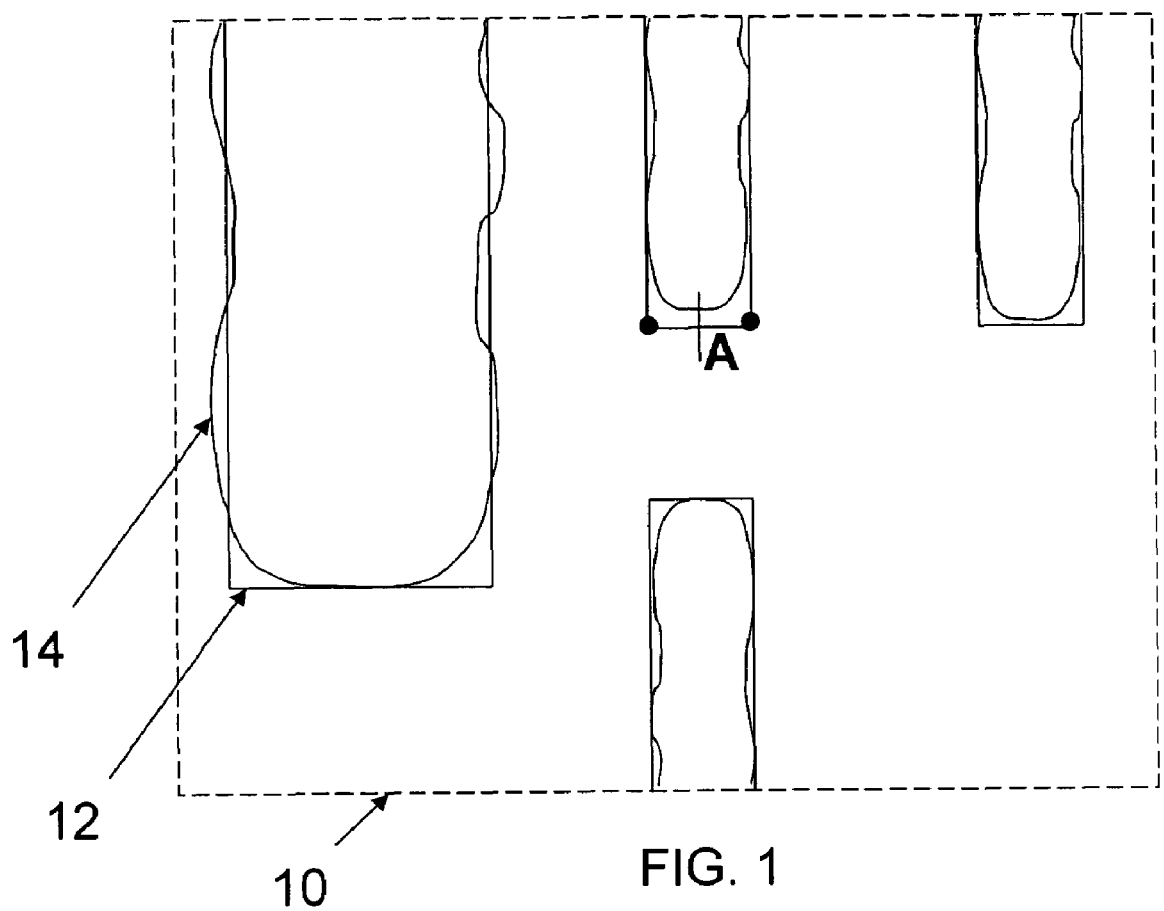
FIG. 1 is an exemplary illustration of a section of a target image and a predicted image superimposed thereon.
Figure 4:
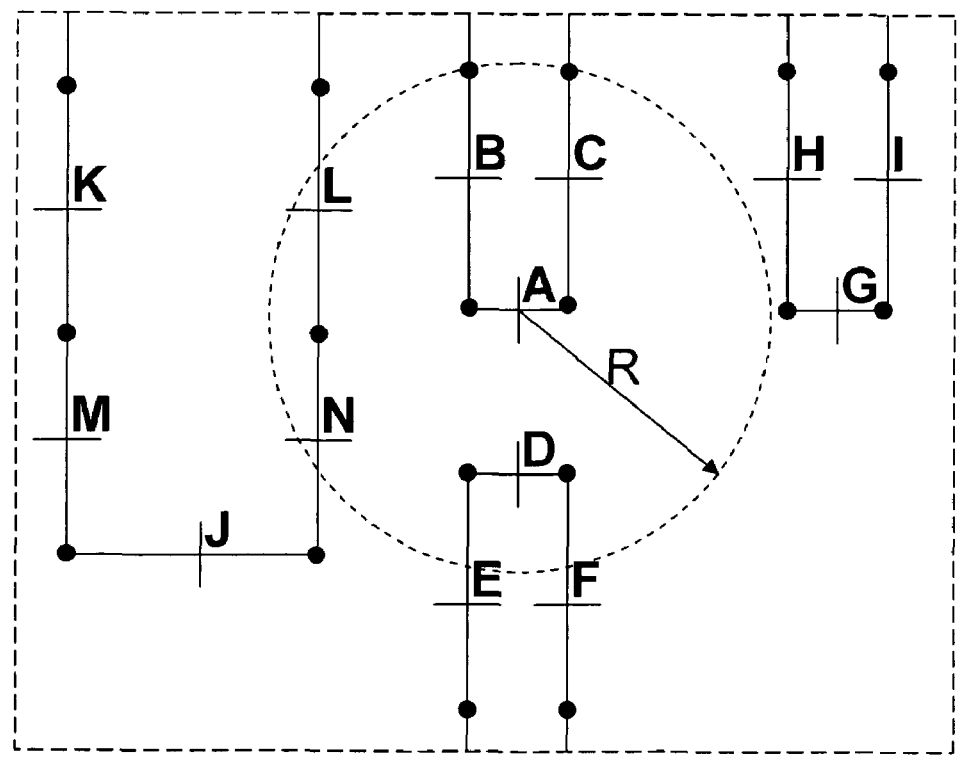
FIG. 4 illustrates an exemplary section of the target image in accordance with the present invention.

FIG. 4 illustrates an exemplary section of a target pattern. For ease of explanation, the target pattern shown in FIG. 4 is the same as that illustrated by FIG. 1. Of course, any pattern maybe analyzed with the method described herein. The target pattern is divided into a plurality of sections, defined by evaluation points A-N, in this example. These evaluation points may be selected in numerous manners. Typically, a lithographer may choose line ends and partitioned feature edges.

Figure 2:
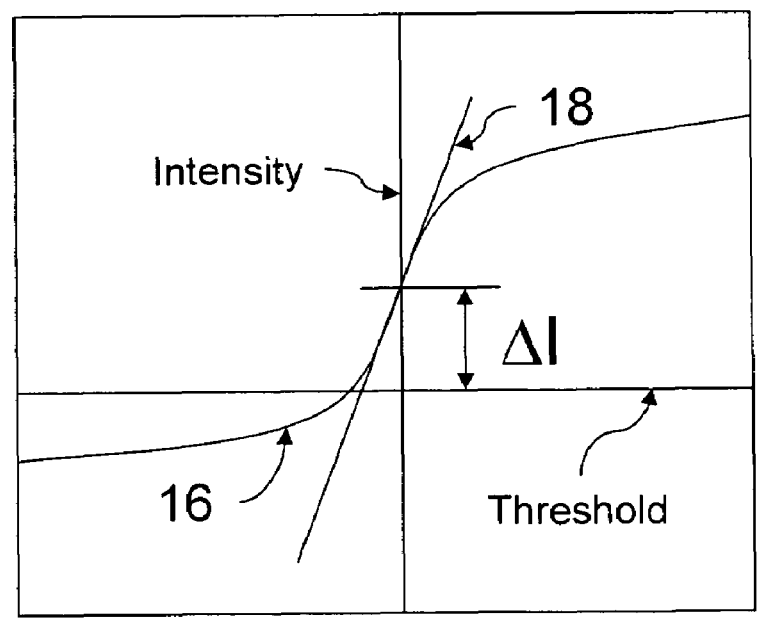
FIG. 2 is a plot illustrating the amount of deviation, in terms of intensity, between the target image and the predicted image at a single evaluation point, such as that illustrated by FIG. 1.
Figure 5:
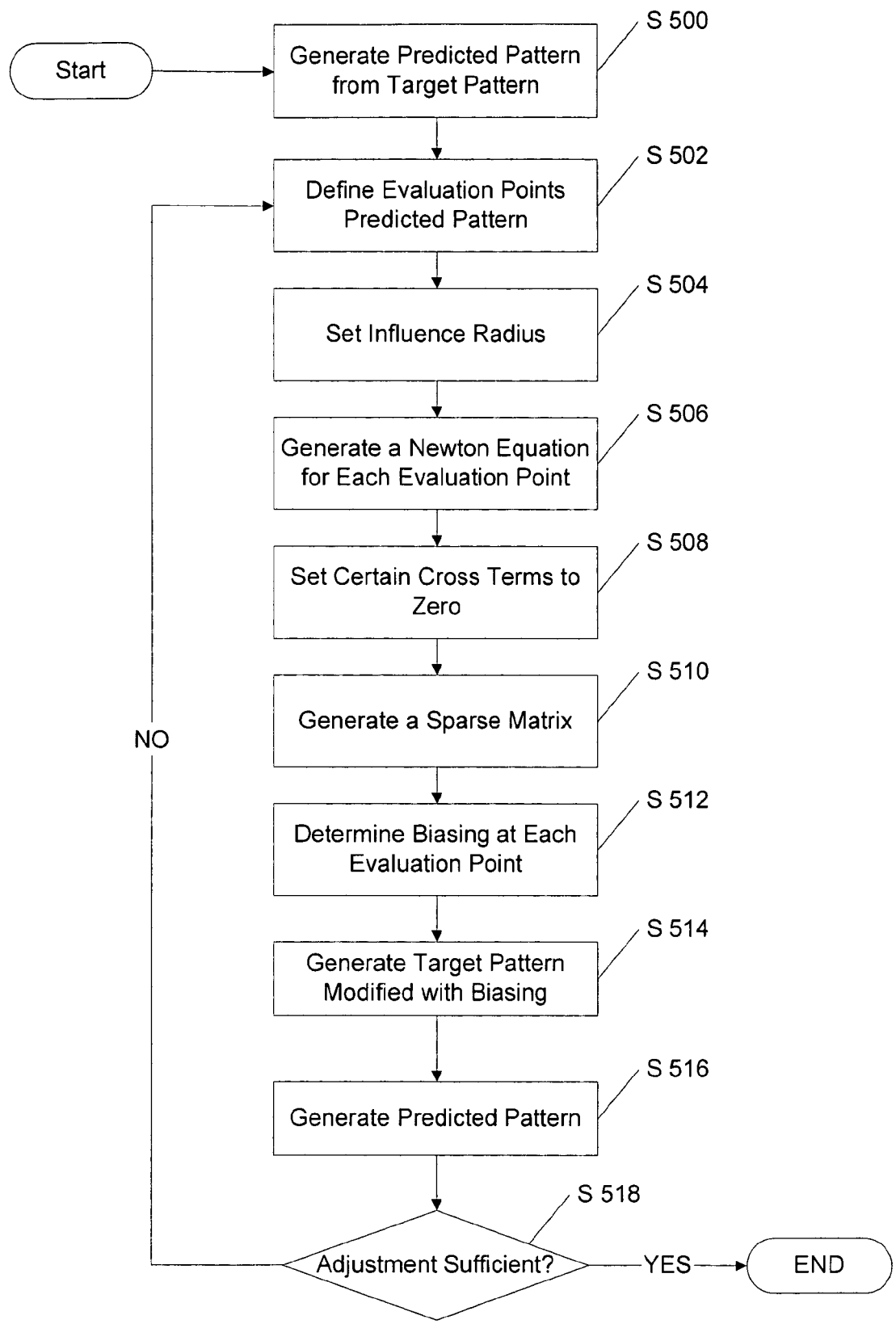
FIG. 5 is an exemplary flow chart illustrating the method for determining bias for a mask by factoring influence of neighboring structures in accordance with the present invention.

FIG. 5 illustrates a flow chart of the process for implementing the novel concepts described herein. In FIG. 5, "Step" will be abbreviated by the letter "S." In Step 500, a predicted pattern is generated from a target pattern. FIG. 2 generally illustrates an exemplary predicted pattern 14, and therefore will not be illustrated in other figures. Various methods may be utilized for generating a predicted pattern based on a target pattern. Exemplary software packages such as MASKWEAVER™ by ASML MASKTOOLS™ may be utilized. MASKWEAVER™ is powerful mask design and optimization tool targeted at the sub-100 nm technology modes. It was developed specifically to help address the low $k_1$ imaging requirements of semiconductor manufacturers at advanced nodes. MASKWEAVER™ also provides a full-chip, hierarchical, model-based optical proximity correction capability with native implementation of ASML's patented chromeless phase lithography (CPL™) technologies.

In Step 502, a lithographer may select a plurality of evaluation points, as is shown in FIG. 4, for example. All evaluation points may be selected for analysis or a group of adjacent evaluation points may be selected. Alternatively, evaluation points or sections may be selected by defining an area of the target image to analyze, and positioning a centroid of the area relative to an evaluation point. The area should encompass at least two evaluation points. Any type of area may be considered, however, for explanation purposes a circular area is chosen.

In Step 504, the influence radius is set to form an influence circle. Ideally, the influence circle should cover the entire area of a given target image. However, distant features have less affect or influence on intensity at a given evaluation point on the target image. Naturally, there is a tradeoff with setting the influence radius. As the influence radius increases, so does the accuracy of the bias calculations at each of the evaluation points encompassed by the influence circle. However, computation time dramatically increases. As the influence radius decreases, so does the accuracy of the bias calculation at each of the evaluation points. However, computation time decreases. If the influence radius is set to zero or a value such that the influence circle does not encompass any other evaluation points, bias calculations would be consistent with conventional MOPC. Generally, a reasonable influence radius may be set to one or two times $\lambda/NA$ (i.e., multiples of $\lambda/NA$) of the lithographic apparatus or to encompass at least one other evaluation point. Referring to FIG. 4, the influence radius has been denoted by the variable R. In this exemplary figure, the influence circle encompasses evaluation points A, B, C, D, L, N. Naturally, the influence radius R could be increased so the influence circle encompasses other evaluation points.

In Step 506, a Newton equation is generated for each evaluation point encompassed by the influence circle or more generally, for each evaluation point selected by a lithographer. Considering exemplary FIG. 4, there will be six Newton equations, one for each evaluation point encompassed by the influence circle. Recall that equation 1 (reproduced below) represents a Newton equation.

$$\rightarrow \Delta F = \Delta I \left( \frac{\partial xy}{\partial I} \right) \quad \text{Equation 1}$$

Equation 1 may be modified by replacing $\partial xy/\partial I$ with $\partial fxy/\partial I$, which represents biasing of multiple points. Therefore, "I" will be responsive to a change of an edge at an evaluation point other than the evaluation point for which the given equation is solved.

Equation 2 below corresponds to Equation 1 that has been modified as described above, simplified and solved for $\Delta I$.

$$\text{Equation 2} \rightarrow \overline{\Delta I} = \overline{\partial I} \cdot \overline{\Delta F}$$

Variables $\overline{\Delta I}$ and $\overline{\partial I}$ are known. Therefore, Equation 2 may be solved for $\overline{\Delta F}$ to determine the amount of bias needed at a given evaluation point. Because there are multiple evaluation points, there will be series of equations. Shown below is a series of equations in expanded form for evaluation points A, B, C, D, L, N of exemplary FIG. 4.

$$\Delta I_A = \frac{\partial I_A}{\partial fxy_A} \cdot \Delta F_A + \frac{\partial I_A}{\partial fxy_B} \cdot \Delta F_B +$$
$$\frac{\partial I_A}{\partial fxy_C} \cdot \Delta F_C + \frac{\partial I_A}{\partial fxy_D} \cdot \Delta F_D + \frac{\partial I_A}{\partial fxy_L} \cdot \Delta F_L + \frac{\partial I_A}{\partial fxy_N} \cdot \Delta F_N$$

$$\Delta I_B = \frac{\partial I_B}{\partial fxy_A} \cdot \Delta F_A + \frac{\partial I_B}{\partial fxy_B} \cdot \Delta F_B + \frac{\partial I_B}{\partial fxy_C} \cdot \Delta F_C +$$
$$\frac{\partial I_B}{\partial fxy_D} \cdot \Delta F_D + \frac{\partial I_B}{\partial fxy_L} \cdot \Delta F_L + \frac{\partial I_B}{\partial fxy_N} \cdot \Delta F_N$$

$$\Delta I_C = \frac{\partial I_C}{\partial fxy_A} \cdot \Delta F_A + \frac{\partial I_C}{\partial fxy_B} \cdot \Delta F_B + \frac{\partial I_C}{\partial fxy_C} \cdot \Delta F_C +$$
$$\frac{\partial I_C}{\partial fxy_D} \cdot \Delta F_D + \frac{\partial I_C}{\partial fxy_L} \cdot \Delta F_L + \frac{\partial I_C}{\partial fxy_N} \cdot \Delta F_N$$

$$\Delta I_D = \frac{\partial I_D}{\partial fxy_A} \cdot \Delta F_A + \frac{\partial I_D}{\partial fxy_B} \cdot \Delta F_B + \frac{\partial I_D}{\partial fxy_C} \cdot \Delta F_C +$$
$$\frac{\partial I_D}{\partial fxy_D} \cdot \Delta F_D + \frac{\partial I_D}{\partial fxy_L} \cdot \Delta F_L + \frac{\partial I_D}{\partial fxy_N} \cdot \Delta F_N$$

$$\Delta I_L = \frac{\partial I_L}{\partial fxy_A} \cdot \Delta F_A + \frac{\partial I_L}{\partial fxy_B} \cdot \Delta F_B + \frac{\partial I_L}{\partial fxy_C} \cdot \Delta F_C +$$
$$\frac{\partial I_L}{\partial fxy_D} \cdot \Delta F_D + \frac{\partial I_L}{\partial fxy_L} \cdot \Delta F_L + \frac{\partial I_L}{\partial fxy_N} \cdot \Delta F_N$$

$$\Delta I_N = \frac{\partial I_N}{\partial fxy_A} \cdot \Delta F_A + \frac{\partial I_N}{\partial fxy_B} \cdot \Delta F_B + \frac{\partial I_N}{\partial fxy_C} \cdot \Delta F_C +$$
$$\frac{\partial I_N}{\partial fxy_D} \cdot \Delta F_D + \frac{\partial I_N}{\partial fxy_L} \cdot \Delta F_L + \frac{\partial I_N}{\partial fxy_N} \cdot \Delta F_N$$

Recall that factor $\overline{\partial I}$ is known. Therefore, in Step 508, to simplify calculations, the values of $\overline{\partial I}$ that are close to zero may be set to zero. There, however, is a tradeoff. Accuracy decreases as the number of factors set to zero increases. Regardless, by setting some factors to zero a sparse matrix may be formed, as in Step 510. In Step 512, the biasing $\overline{\Delta F}$ at each evaluation point is determined by solving the matrix for each variable. Methods for solving sparse matrices are well known, and exemplary mathematical software programs, such as MATLAB, may be utilized for this purpose.

Steps 508 and 510 are for simplifying computation. However, these steps may be omitted, but again there is a tradeoff because computation time increases. Regardless, such simplification may not be required given a computer system that can solve for a complex set of equations.

Figure 3:
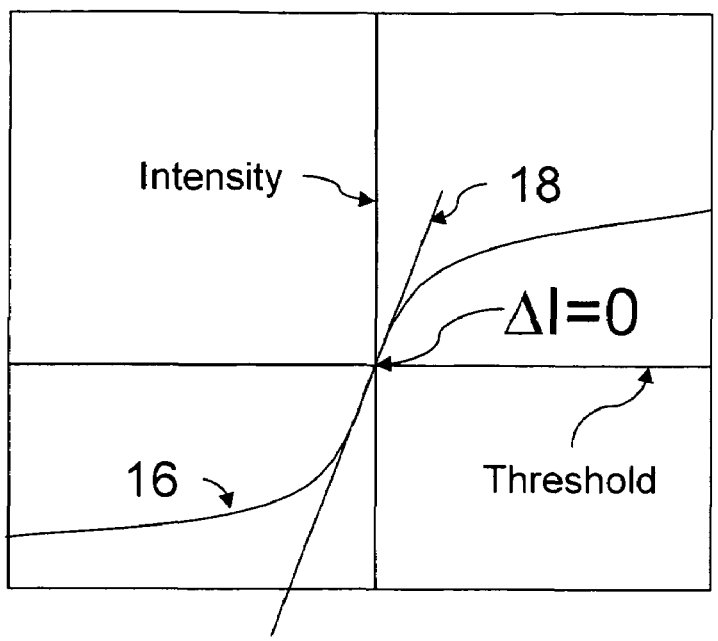
FIG. 3 is a plot similar to that of FIG. 2 but illustrating zero deviation between the target image and the predicted image at a single evaluation point, such as that illustrated by FIG. 1.
Figure 6:
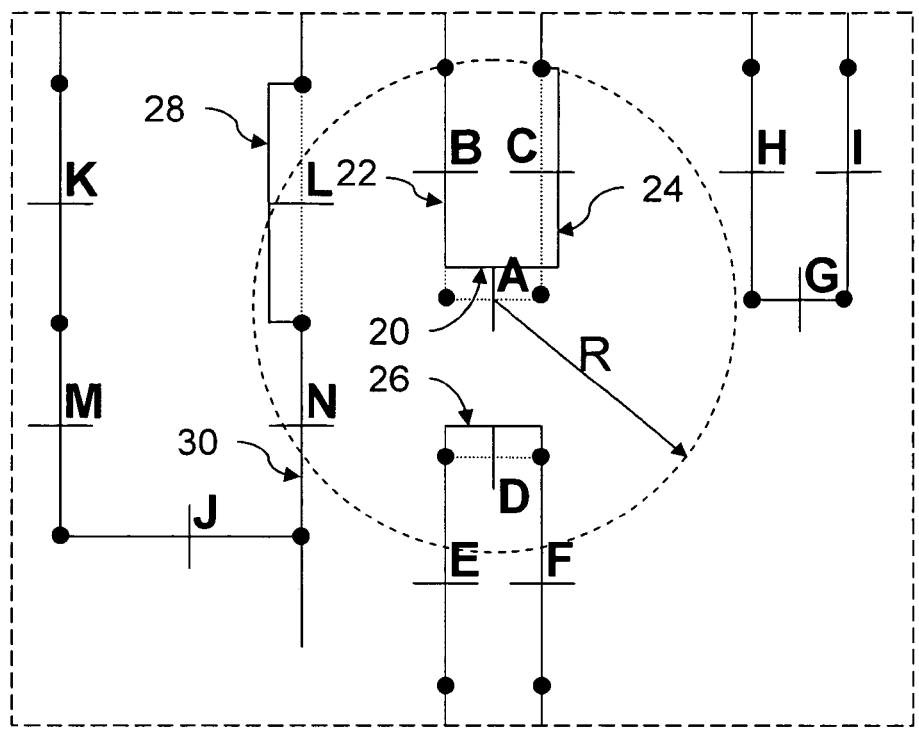
FIG. 6 illustrates an exemplary section of a modified target image in accordance with the present invention.

In Step 514, the target pattern is modified with the biasing computed in Step 512. FIG. 6 illustrates an exemplary modified target image corresponding to the target image illustrated by FIG. 3. It is important to note that the modified target image is not based on actual calculations and is for illustrative and explanatory purposes only. In this example, however, sections 20, 24, 26 and 28, corresponding to evaluation points A, C, D and L, respectively, have been biased. Sections 22 and 30, corresponding to evaluation points B and N, respectively, were not biased.

In Step 516, the modified target pattern generated in Step 514 is used to generate a new predicted pattern (not shown). The predicted pattern may be generated in the same manner described above. In Step 518, it is determined whether or not the biasing is sufficient.

A lithographer may analyze the sufficiency of the MOPC bias adjustments in Step 518 by determining the deviation between the predicted image and modified target image. This may be done by determining if the deviation meets, or falls within, a predetermined tolerance. If the predicted image is within the predetermined tolerance, then MOPC has been completed. However, if the predicted image is outside of the predetermined tolerance, then MOPC is repeated, returning to Step 502. MOPC may be repeated until the predetermined tolerance has been met.

If MOPC (i.e., bias adjustments of features) is unable to meet the predetermined tolerance, equipment exposure settings and scatting bars may be adjusted. U.S. patent application Ser. No. 10/878,489, entitled "A method, program product and apparatus of simultaneous optimization for NA-Sigma exposure settings and scattering bars OPC using a device layout" describes novel techniques in which lithographic apparatus settings may be optimized for any pattern concurrently with MOPC. This application is incorporated herein by reference in its entirety.

The above-described example corresponds to a single exposure system. However, the set of equations may be modified to accommodate lithography utilizing double exposure or even multiple exposures, as shown by Equation 3 below.

$$\text{Equation 3} \rightarrow \overline{\Delta I} = \overline{\partial I}|_{exp1} \cdot \overline{\Delta F}_{exp1} + \overline{\partial I}|_{exp2} \cdot \overline{\Delta F}_{exp2} + \ldots + \overline{\partial I}|_{expn} \cdot \overline{\Delta F}_{expn}$$

The above-described concepts may further enhance conventional mask optimization techniques, such as rule-based mask optimization or traditional OPC techniques. For instance, conventional techniques may be performed initially, and the above-described concepts may be performed to further enhance conventional optimization techniques.

Software may implement or aid in performing the disclosed concepts. Software functionalities of a computer system involve programming, including executable code, may be used to implement the above described optimization techniques. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Figure 7:
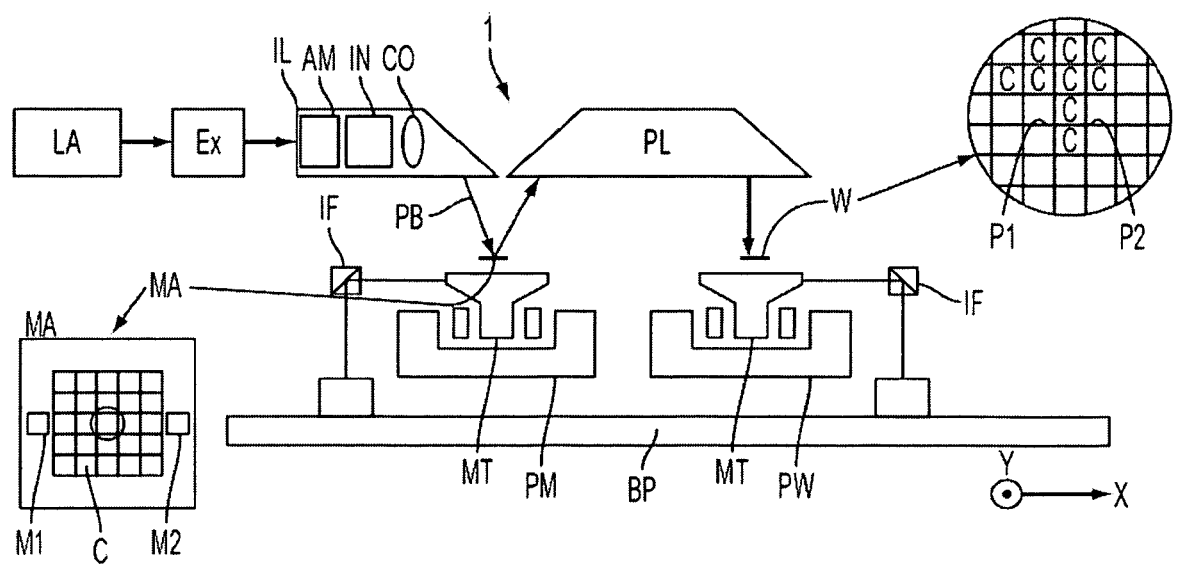
FIG. 7 illustrates an exemplary lithographic projection apparatus.

FIG. 7 schematically depicts a lithographic projection apparatus suitable for use with a mask designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 7 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 7. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method for optimizing a mask pattern to be imaged on a surface of a substrate, the method comprising the steps of:
   (a) generating a target pattern to be imaged;
   (b) simulating a predicted pattern from the target pattern to be formed on the surface of the substrate;
   (c) sectioning features of the target pattern and selecting at least two sections for evaluation;
   (d) computing an amount of bias needed for each of the at least two sections by factoring the influence from at least one other section of the at least two sections; and
   (e) modifying the target pattern according to the results of step (d) for optimizing the mask pattern.

2. The method according to claim 1, the method further comprising the steps of:
   (f) simulating a second predicted pattern from the modified target pattern of step (e);
   (g) analyzing the second predicted pattern to determine if the modified target pattern has been biased sufficiently for optimizing the mask pattern; and
   (h) if from step (g) biasing is insufficient, repeating steps (d) through steps (g), wherein the modified target pattern of step (e) becomes the target pattern of step (c).

3. The method according to claim 2, wherein if from step (g) biasing is sufficient, generating an optimized mask according to the modified target pattern.

4. The method according to claim 1, wherein in step (c), the at least two sections are adjacent to one another.

5. The method according to claim 1, wherein step (c) further comprises the steps of:
   (i) defining an area of the target pattern having a parameter that is greater than or equal to $\lambda/NA$ for a given illumination system;
   (ii) positioning a centroid of the area relative to one of the at least two sections for evaluation.

6. The method according to claim 5, wherein the area corresponds to a circle and the parameter corresponds to the radius of the circle.

7. The method according to claim 1, wherein step (d) further comprises the steps of:
 (i) generating a series of equations for each of the at least two sections; and
 (ii) setting near-zero factors to zero to generate a sparse matrix.

8. A computer program product, comprising executable code stored on and transportable by at least one computer readable medium, wherein execution of the code by at least one programmable computer causes the at least one programmable computer to perform a sequence of steps for optimizing a mask pattern to be imaged on a surface of a substrate, comprising the steps of:
 (a) generating a target pattern to be imaged;
 (b) simulating a predicted pattern from the target pattern to be formed on the surface of the substrate;
 (c) sectioning features of the target pattern and selecting at least two sections for evaluation;
 (d) computing an amount of bias needed for each of the at least two sections by factoring the influence from the other section(s) of the at least two sections; and
 (e) modifying the target pattern according to the results of step (d) for optimizing the mask pattern.

9. The computer program product according to claim 8, further comprising the steps of:
 (f) simulating a second predicted pattern from the modified target pattern of step (e);
 (g) analyzing the second predicted pattern to determine if the modified target pattern has been biased sufficiently for optimizing the mask pattern; and
 (h) if from step (g) biasing is insufficient, repeating steps (d) through steps (g), wherein the modified target pattern of step (e) becomes the target pattern of step (c).

10. The computer program product according to claim 9, wherein if from step (g) biasing is sufficient, generating an optimized mask according to the modified target pattern.

11. The computer program product according to claim 8, wherein in step (c), the at least two sections are adjacent to one another.

12. The computer program product according to claim 8, wherein step (c) further comprises the steps of:
 (i) defining an area of the target pattern having a parameter that is greater than or equal to $\lambda/NA$ for a given illumination system;
 (ii) positioning a centroid of the area relative to one of the at least two sections for evaluation.

13. The computer program product according to claim 12, wherein the area corresponds to a circle and the parameter corresponds to the radius of the circle.

14. The computer program product according to claim 8, wherein step (d) further comprises the steps of:
 (i) generating a series of equations for each of the at least two sections; and
 (ii) setting near-zero factors to zero to generate a sparse matrix.

15. An apparatus utilizing model optical proximity correction (MOPC) for optimizing a pattern to be formed on a surface of a substrate, said apparatus comprising:
 a radiation system for supplying a projection beam;
 an illuminator for receiving the projection beam of radiation and projecting an adjusted beam of radiation a portion of a mask; and
 a projection system having a numerical aperture ("NA") for imaging a corresponding irradiated portion of a mask, onto a target portion of a substrate; and
 a computer system for performing the steps comprising of:
  (a) generating a target pattern to be imaged;
  (b) simulating a predicted pattern from the target pattern to be formed on the surface of the substrate;
  (c) sectioning features of the target pattern and selecting at least two sections for evaluation;
  (d) computing an amount of bias needed for each of the at least two sections by factoring the influence from at least one other section of the at least two sections; and
  (e) modifying the target pattern according to the results of step (d) for optimizing the mask pattern.

16. The apparatus according to claim 15, the computer system further performing the steps of:
 (f) simulating a second predicted pattern from the modified target pattern of step (e);
 (g) analyzing the second predicted pattern to determine if the modified target pattern has been biased sufficiently for optimizing the mask pattern; and
 (h) if from step (g) biasing is insufficient, repeating steps (d) through steps (g), wherein the modified target pattern of step (e) becomes the target pattern of step (c).

17. The apparatus according to claim 16, wherein if from step (g) biasing is sufficient, generating an optimized mask according to the modified target pattern.

18. The apparatus according to claim 15, wherein in step (c), the at least two sections are adjacent to one another.

19. The apparatus according to claim 15, wherein step (c) further comprises the steps of:
 (i) defining an area of the target pattern having a parameter that is greater than or equal to $\lambda/NA$ for a given illumination system;
 (ii) positioning a centroid of the area relative to one of the at least two sections for evaluation.

20. The apparatus according to claim 19, wherein the area corresponds to a circle and the parameter corresponds to the radius of the circle.

21. The apparatus according to claim 15, wherein step (d) further comprises the steps of:
 (i) generating a series of equations for each of the at least two sections; and
 (ii) setting near-zero factors to zero to generate a sparse matrix.

* * * * *